United States Patent [19]

Kenney

[11] 4,084,218
[45] Apr. 11, 1978

[54] DC VOLTAGE CONVERTER AND SHOCK-TYPE HIGH VOLTAGE UTILIZATION

[75] Inventor: Frank M. Kenney, Littleton, Colo.

[73] Assignee: U and I Company, Scottsbluff, Nebr.

[21] Appl. No.: 648,624

[22] Filed: Jan. 13, 1976

[51] Int. Cl.² .............................................. H02M 7/00
[52] U.S. Cl. ........................................ 363/18; 363/60
[58] Field of Search ................... 321/15; 331/117 R; 363/59, 60, 61, 18

[56] References Cited

U.S. PATENT DOCUMENTS

| | | | |
|---|---|---|---|
| 3,533,010 | 10/1970 | Bowles | 321/15 X |
| 3,849,717 | 11/1974 | Walz et al. | 321/15 |
| 3,869,659 | 3/1975 | Doong et al. | 321/15 |
| 3,986,085 | 10/1976 | Weber | 321/15 X |

OTHER PUBLICATIONS

"Negative Resistance Shown in Dual FET Device", *Electronics*, Apr. 18, 1974, pp. 52-53.

*Primary Examiner*—William M. Shoop
*Attorney, Agent, or Firm*—Ancel W. Lewis, Jr.

[57] ABSTRACT

A DC voltage converter includes an oscillator that converts a DC battery voltage to an oscillating voltage, a low voltage transformer that increases the oscillating voltage to a higher oscillating voltage, and a voltage rectifying-capacitor charging network that increases the higher oscillating voltage to yet a higher DC voltage at an output terminal for DC high voltage utilization devices and the like. An electric switch portion is selectively actuated by the user to apply the battery voltage to the oscillator, resulting in the generation of the stepped-up DC voltage at the output terminal. Utilization devices for the voltage developed by the converter shown are a miniature animal training device and a cattle prod device. The miniature animal training device has a pair of outwardly projecting electrodes mounted on a side at one end of the housing that is sized and shaped to fit within and conform to the palm of a hand. The batteries, converter and electric switch portion are contained in the housing whereby the device produces a stepped-up DC voltage at said output terminal upon the depression of one of the electrodes as both electrodes are pressed against an object to be electrically shocked. The cattle prod device has a pair of electrodes mounted on the end of a housing assembly made up of telescoping tubular housing sections with one housing section containing the batteries, converter and electric switch portion whereby the pressing of the electrodes against an object to be shocked causes a shock of the object. The housing assembly is releasably supported by a rigid handle or an extensible handle assembly.

13 Claims, 17 Drawing Figures

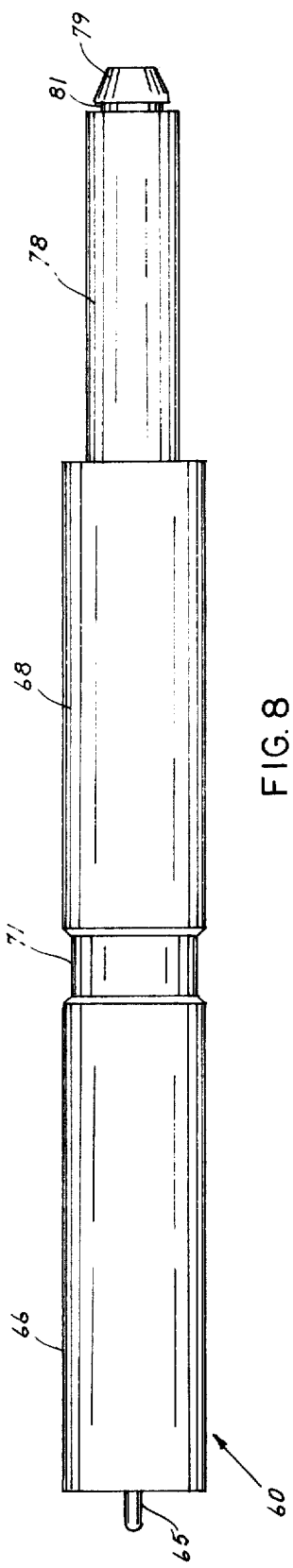
FIG. 8
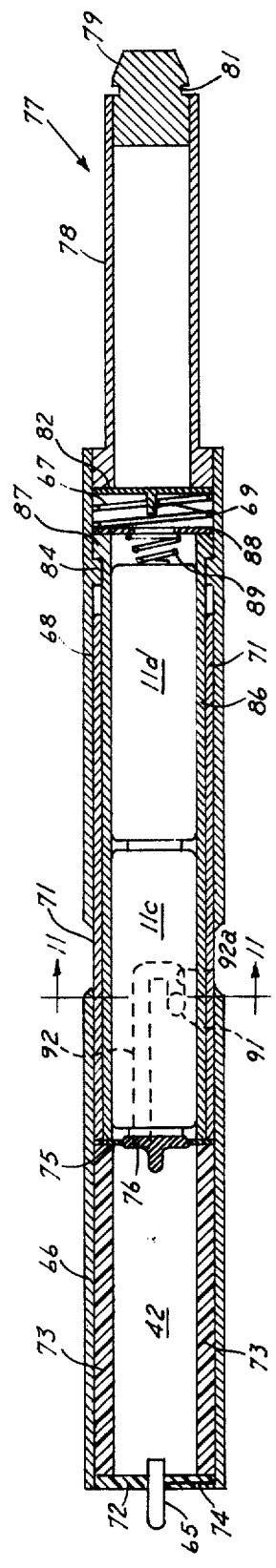
FIG. 9
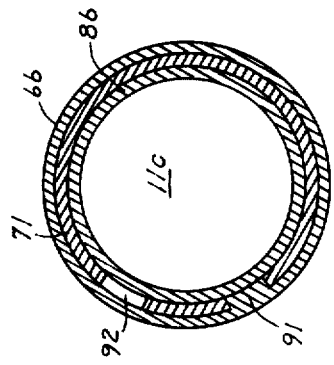
FIG. 10
FIG. 11
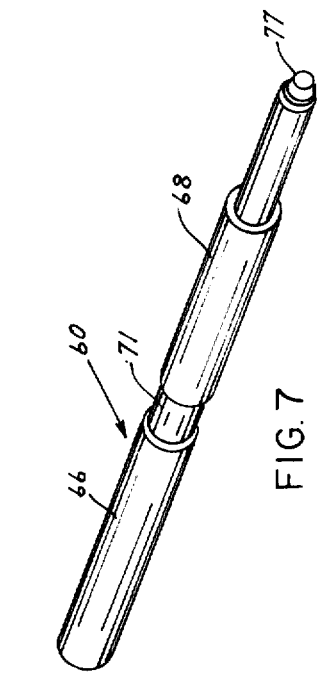
FIG. 7

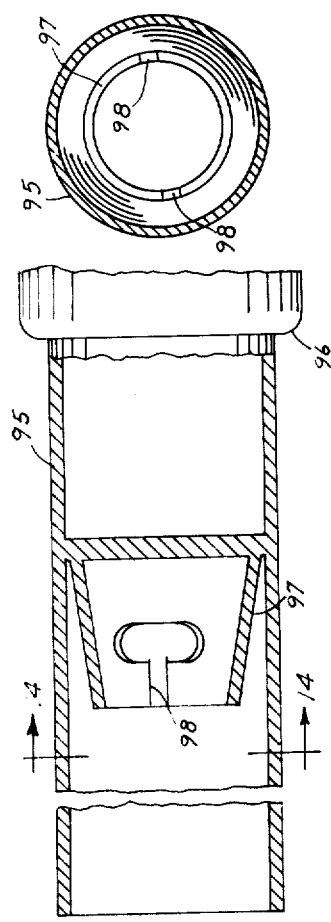
FIG. 12
FIG. 13
FIG. 14
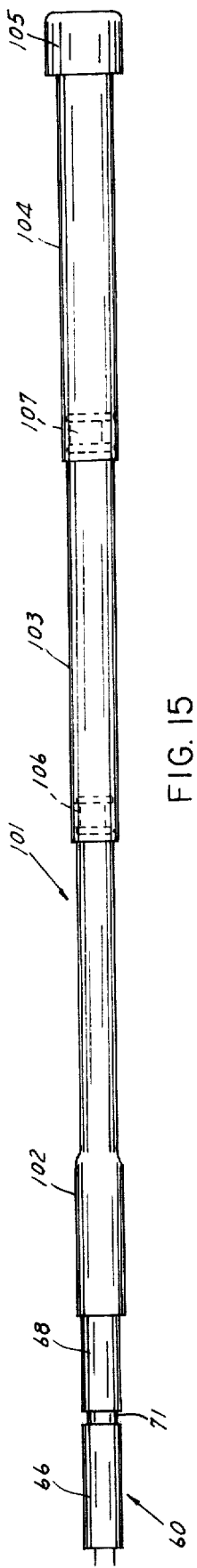
FIG. 15
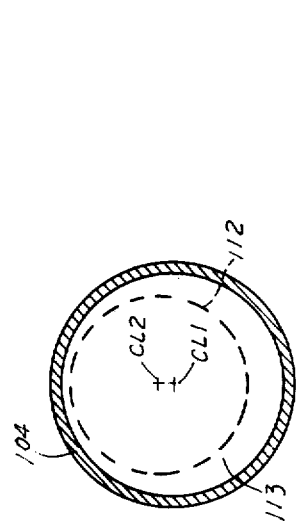
FIG. 17
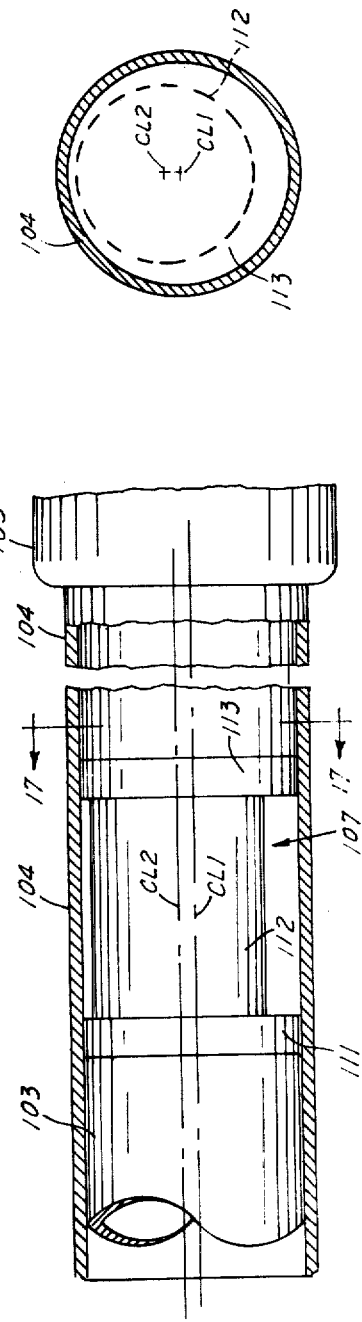
FIG. 16

4,084,218

DC VOLTAGE CONVERTER AND SHOCK-TYPE HIGH VOLTAGE UTILIZATION

FIELD OF THE INVENTION

This invention relates generally to DC converters and voltage utilization devices and more particularly to a novel DC converter and voltage utilization shock-type training and prod devices and the like.

BACKGROUND OF THE INVENTION

Various types of DC voltage converters have heretofore been used to convert the voltage of a relatively small sized, relatively low voltage dry cell battery to a considerably higher DC voltage. Prior known DC voltage converters are found in various types of electric shock devices and known shock devices employ a DC converter having a saturated core high voltage transformer which has a primary, a secondary, and feedback windings together with two transistors or like solid state devices that switch on and off. In the operation of this device the transformer becomes saturated to provide amplification of the voltage and/or current. The size of the saturated core transformer is prohibitive for many applications.

Accordingly, it is an object of this invention to provide a novel DC converter that delivers a relatively high DC voltage from a relatively small, relatively low voltage dry cell battery or batteries.

Another object of this invention is to provide a novel electric DC step-up converter that may be constructed as a relatively small, compact unit and will convert relatively low battery voltages to relatively high, substantially DC voltages at relatively small currents for voltage utilization devices such as, for example, a novel miniature animal training device, a novel cattle prod device and the like.

A further object of this invention is to provide a novel miniature animal training device with a DC converter that will fit entirely within the palm of a hand.

Still a further object of this invention is to provide a novel battery powered cattle prod device with a DC converter that is adapted to releasably mount on a rigid or extensible handle assembly.

SUMMARY OF THE INVENTION

In accordance with the present invention there is provided a DC voltage converter that has an oscillator which changes a relatively low DC voltage to an oscillating voltage which in turn is stepped up by a low voltage transformer to a higher oscillating voltage. This higher oscillating voltage is applied to a series of rectifiers that rectify the oscillating voltage and capacitors of decreasing value in a storage and rectifying network that is selectively applied by the actuation of an electric switch portion to provide a stepped-up substantially DC voltage at an output terminal. Voltage utilization devices for said converter shown are in the form of a miniature animal training device that has a housing readily positioned within the palm of a hand that contains a battery or batteries, a converter, an electric switch portion, and has voltage applying electrodes which when pressed against an object provide a shock. A cattle prod device has a telescoping tube assembly containing the battery or batteries, converter, electric switch portion and has voltage applying electrodes at one end.

Other objects, advantages and capabilities of the present invention will become more apparent as the description proceeds taken in conjunction with the accompanying drawings, in which like parts have similar reference numerals and in which:

FIG. 7 is a perspective view of a cattle prod device in accordance with the present invention;

FIG. 8 is a side elevation view of the cattle prod device of FIG. 7 drawn to full scale;

FIG. 9 is a vertical sectional view through the cattle prod device of FIG. 8;

FIG. 10 is a front end elevational view of FIG. 9;

FIG. 11 is a sectional view taken along line 11—11 of FIG. 10 through the socket but with the battery not sectional;

FIG. 12 is a side elevation view of the cattle prod device of FIGS. 7-11 releasably inserted into the open end portion of a rigid handle;

FIG. 13 is an enlarged fragmentary sectional view of the socket inset from the open end of the rigid handle and its end portion of FIG. 12 that receives the male end of the cattle prod device of FIGS. 7-11;

FIG. 14 is a sectional view taken along lines 14—14 of FIG. 13;

FIG. 15 is a side elevation view of the cattle prod device of FIGS. 7-11 releasably inserted into an extensible handle;

FIG. 16 is a sectional view of two telescoping sections of the extensible handle of FIG. 13 illustrating the slidable eccentric lock; and FIG. 17 is a sectional view taken along lines 17—17 of FIG. 16.

DESCRIPTION OF THE PREFERRED EMBODIMENTS

Figure 1:
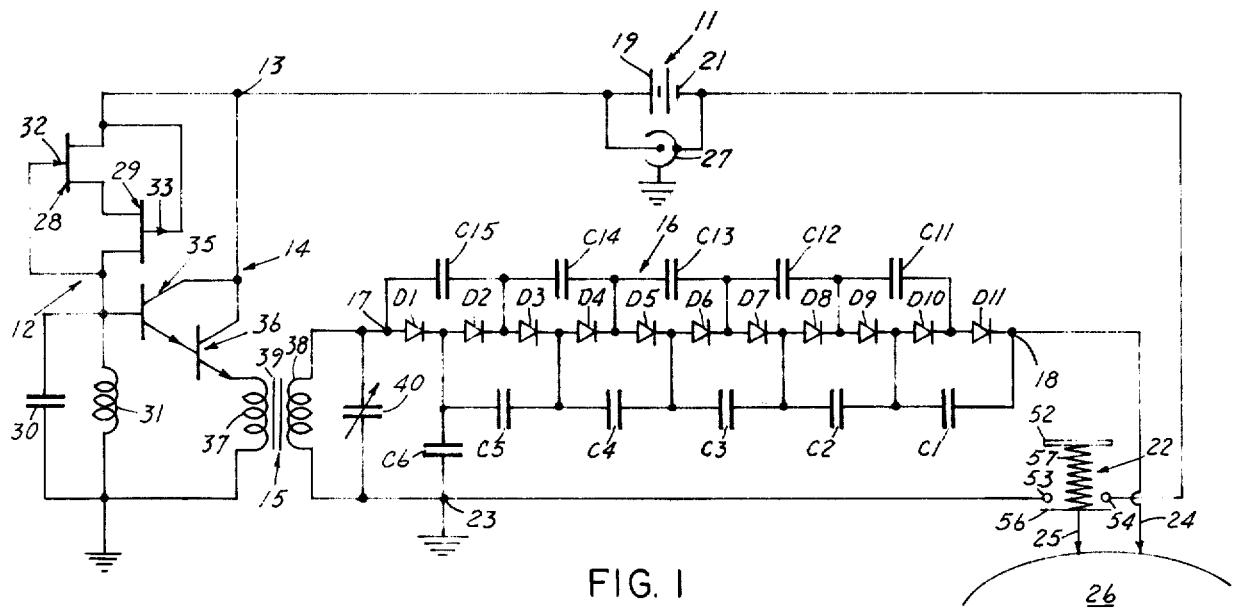
FIG. 1 is a schematic electric circuit diagram of a DC voltage step-up converter and schematic portions of a miniature animal training device constructed in accordance with the present invention.
Figure 3:
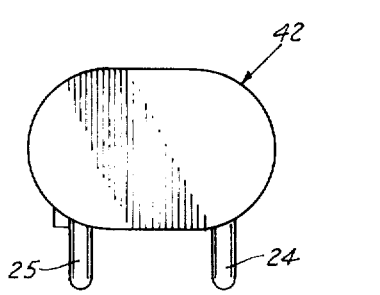
FIG. 3 is an end elevation view of the device of FIG. 2 opposite the end having the battery charging jack, drawn to scale and to two times actual size.
Figure 2:
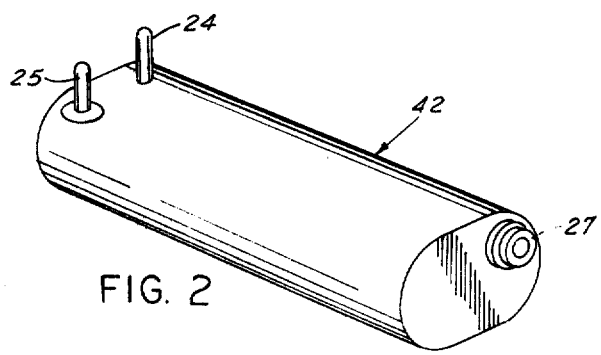
FIG. 2 is a perspective view of a miniature animal training device constructed in accordance with the present invention.
Figure 4:
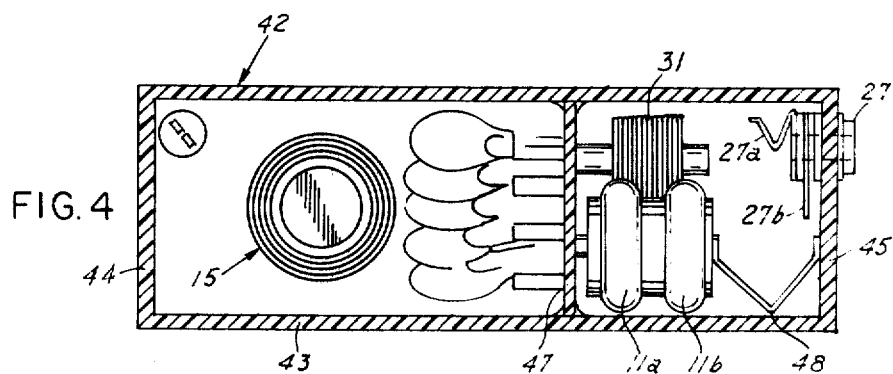
FIG. 4 is a sectional view through the long axis of the device of FIGS. 2 and 3.

Referring now to FIG. 1, there is shown a schematic electric circuit diagram for a DC voltage converter that steps up the DC voltage of one or more dry cell batteries represented schematically as a battery and designated by numeral 11. The converter shown in FIG. 1 has an oscillator 12 with a power input terminal designated by numeral 13, an impedance interface 14, a low voltage step-up transformer 15, and a voltage rectifying capacitor charging network 16 with a power input terminal designated 17 and output terminal designated 18. In the converter shown in FIG. 1 the battery 11 has its cathode 19 connected to the power input terminal 13 and its anode 21 normally ungrounded and connected through an electric switch portion 22 to ground designated by numeral 23. In addition there is represented in the circuit diagram of FIG. 1 a pair of electrodes 24 and 25, electrode 24 being connected to the output terminal 18 and electrode 25 being operatively associated with the electric switch portion 22 so that, when the electrodes are pressed against an object represented at 26, the battery anode is connected to ground 23 and this completes the circuit via the electric switch portion 22 so that the DC voltage of battery 11 is applied to the oscillator stage 12 and a stepped-up DC voltage generated by the circuit in response to the battery voltage appears at output terminal 18. The electric switch portion 22 shown in FIG. 1 is a schematic representation of the type used in the miniature animal training device described in more detail hereinafter with reference to FIGS. 2 through 5. A jack 27 for battery charging is shown schematically in FIG. 1 to facilitate the charging of the dry cell batteries 11 in a conventional manner.

The oscillator 12 comprises a series connected N channel junction field effect transistor 28 and P channel junction field effect transistor 29 which in turn are connected in series with an inductor 31. The transistor 28 has its JFET gate 32 connected to the inductor 31 to be biased at the inductor voltage and the transistor 29 has its JFET gate 33 connected to the input terminal 13 to be biased by the voltage of battery 11. An optional circuit component is capacitor 30 which may be used for tuning the oscillator 12. In general, this oscillator 12 converts the DC voltage of the battery 11 to an oscillating voltage that goes positive and then negative in relation to a zero reference.

The potential across the inductor 31 is applied across a two-stage transistor network connected in a Darlington configuration which includes an NPN transistor 35 having its base connected between inductor 31 and gate 32, its collector connected to input terminal 13, and its emitter connected to the base of a second NPN transistor 36. Transistor 36 in turn has its collector connected to input terminal 13 and its emitter connected to the primary winding 37 of the transformer 15. In this arrangement the potential produced across the inductor 31 is applied across the emitter-base junctions of the two transistors 35 and 36 which are in series with the primary winding 37 of transformer 15 so that the transistors 35 and 36 are high frequency switching devices for the oscillator and amplify the current flowing to the primary winding 37 and are a high impedance in parallel with inductor 31 to interface between the oscillator 12 and the transformer 15.

The low voltage transformer 15 has a primary winding 37 and a secondary winding 38 wound on a core 39. The voltage applied to the primary winding 37 is an oscillating or alternating voltage and induces a voltage in the secondary winding 38 that is then applied to the network 16. A variable capacitor 40 is connected across the secondary winding 38 to tune the oscillator 12 via the impedance reflected back from the secondary winding to the primary winding of transformer 15.

The input terminal designated 17 for the voltage rectifying-capacitor charging network 16 is also the output terminal of the secondary winding 38. This network 16 has a charging capacitor C6 and rectifying diode D1 connected in series with one another between input terminal 17 and ground 23. A plurality or train of successive charging capacitors C5, C4, C3, C2, and C1 are connected in a series circuit including diode D1 between the input terminal 17 and output terminal 18.

Across each of the charging capacitors C5, C4, C3, C2 and C1 there are two series connected diodes designated D2, D3; D4, D5; D6, D7; D8, D9; and D10, D11, respectively, which rectify the oscillating voltage applied to charge the capacitors. Diode D1 is connected to diode D2 so that between input terminal 17 and output terminal 18 there are connected in series eleven diodes designated D1 through D11, respectively.

Across each pair of series connected diodes there is a neutralizing and charging capacitor and specifically across diodes D1 and D2 capacitor C15 and across diodes D2 and D3 capacitor C5. There is further connected across diodes D3 and D4 capacitor C14, across diodes D4 and D5 capacitor C4, across diodes D5 and D6 capacitor C13, across diodes D6 and D7 capacitor C3, across diodes D7 and D8 capacitor C12, across diodes D8 and D9 capacitor C2, across diodes D9 and D10 capacitor C11, and across diodes D10 and D11 capacitor C1 with diode D11 and capacitor C1 being connected to the output terminal 18 with object 26 becoming the load resistance for the circuit. Capacitors C11, C12, C13, C14, and C15 are in series with one another. There is a neutralizing and charging capacitor of a corresponding size or capacitance with one of the series of successive charging capacitors. Specifically, the capacitance of C5 and C15 is equal; the capacitance of C4 and C14 is equal; the capacitance of C3 and C13 is equal; the capacitance of C2 and C12 is equal, and the capacitance of C1 and C11 is equal. Beginning with capacitor C6 at the input terminal the capacitance of each is less so that the charging times for each successive capacitor is less from the input terminal 17 to the output terminal 18.

Upon the application of the oscillating or alternating voltage produced at the transformer secondary 38 there is a positive and negative going voltage in relation to a zero reference. When a positive potential is first applied to terminal 17 one plate of capacitor C15 starts to become positively charged. At a certain positive voltage level (0.6v DC) diode D1 conducts and one plate of each of capacitors C5 and C6 that are connected together becomes positively charged. At a certain higher positive voltage (1.2v) diode D2 conducts and a positive potential is now applied to the opposite plate of capacitor C15 which in effect becomes neutralized or has a neutral charge while the common plates of capacitors C5 and C6 continue to become positively charged. As the capacitors C5 through C1 charge positive, then each of the diodes D3 through D11 conducts providing a neutral charge on capacitors C14, D13, C12, and the charges on capacitors C1, C2, C3, C4, C5, and C6 are cumulative to produce a total voltage increase between input terminal 17 and output terminal 18.

In the operation of the circuit, then, when diode D1 is forwardly biased the current flowing through capacitor C6 to ground very nearly equals the current flowing through capacitor C5 because the forward biased diode resistance approaches zero, and when the input voltage at terminal 17 reverses in polarity the current through diode D1 is reversal biased and the current flows across D2 and the direction of the current in and out of capacitors C6 and C5 is reversed but the magnitude of the voltage gain across the capacitor is the same. Mathematically it can be shown that the voltage gain between input terminal 17 and across capacitor C6 is the ratio of the capacitance of C6 and C5 or C6/C5 and the voltage gain across capacitor C4 is C6/C4 so that the voltage increase or voltage gain between terminal 17 and terminal 18 is approximately the sum of: (C6/C5) + (C6/C4) + (C6/C3) + (C6/C2) + (C6/C1).

A miniature animal training device illustrated in more detail in FIGS. 2–5 has a rigid shell or housing 42, preferably made of a molded plastic material shown as including an elongated thin-walled hollow body portion 43 with opposed end wall portions 44 and 45 closing the ends thereof. The transverse cross section of the housing has opposed rounded or radiused side wall portions and opposed flat side wall portions to take the appearance of a flattened cylinder. The pair of electrodes designated 24 and 25 project laterally out from a flattened side wall adjacent one end.

Within the housing 42 there is mounted a circuit board 47 on which a majority of the electric circuit components shown schematically in FIG. 1 are mounted. The transformer 15 is shown mounted inside the housing adjacent the electrodes. Also shown as included in the housing are two dry cell batteries designated 11a and 11b and a bias spring 48 holds the batteries in place. The jack 27 for the battery charger is mounted in the end wall 45 and includes a conductive member 27a that engages the positive male part of a male plug (not shown) and a conductive member 27b insulated from member 27a that engages the negative part of the plug. A conventional battery charger plug (not shown) inserts into this jack 27 to charge the batteries as required.

The electric switch portion or assembly 22 is shown mounted in the housing with the electrode 25 projecting outwardly therefrom and includes a tubular housing 51 and an end cap 52 of a non-conductive material closing the end of the housing opposite the electrode which carries a pair of pin-like terminals 53 and 54. The movable electrode 25 has an enlarged end portion 56 made integral with the electrode 25 that is slidable inside housing 51 and arranged so that the electrode 25 extends through an opening in an end wall opposite wall 54. A spring 57 contained in the housing 51 between cap 54 and the opposite end wall urges the movable electrode 25 to the outer position and, when pressure is applied to the electrode 25, it moves to an inner position in which the enlarged end portion 56 makes an electric connection between the two terminals 53 and 54 to complete the circuit. Upon release of the pressure against the electrode the spring 57 urges the electrode 25 to the outer position which opens the circuit by ungrounding the battery.

Figures 5, 6:
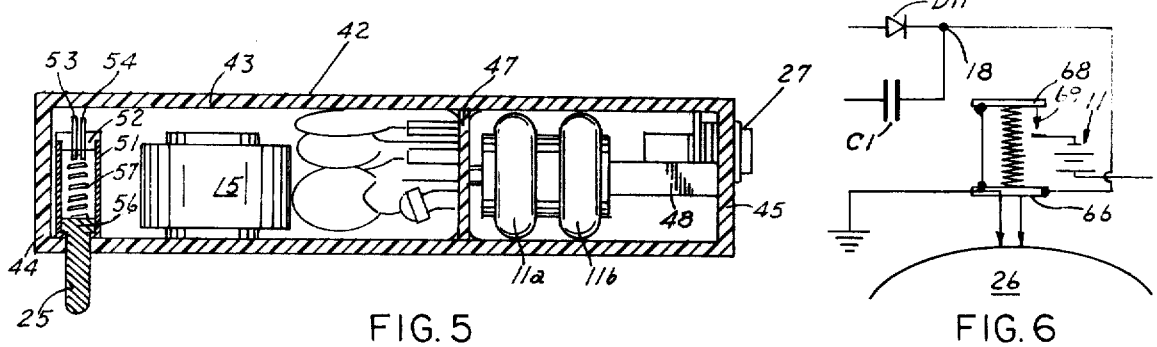
FIG. 5 is a sectional view through the short axis of the device of FIGS. 2 and 3 with the housing broken away to show interior construction and a vertical section through the movable electrode and electric switch portion.
FIG. 6 is a portion of an electric circuit diagram showing a modification of FIG. 1 for the cattle prod device described in the subsequent Figures.

A modification of the circuit diagram of FIG. 1 is shown in FIG. 6 for the cattle prod device designated 60 described hereinafter. This circuit shown has a pair of electrodes designated 64 and 65 which engage object 26. Electrodes 64 and 65 are affixed at the forward end of a conductive forward housing section 66. A spring 67 is held between the forward housing section 66 and a rear housing section 68. When the electrodes are pressed against an object, the electric circuit between the oscillator and battery 11 is completed by grounding one side of the battery 11. The electrical connection is completed between a contact 69 associated with the rear housing section 68 that is urged against the anode of the battery. The rear housing section 68 is shown as electrically connected with the forward housing section 66.

Referring now to FIGS. 8–12, the cattle prod housing assembly shown has the forward outer housing section 66, rear outer housing section 68 and an intermediate housing section 71 telescopically received within the front and rear outer housing sections together with an inner housing section telescoped within the intermediate housing section 71. The forward outer housing section 66 is made of a conductive metal and has a non-conductive front end wall 72 through which the electrodes 64 and 65 project and are affixed. The housing 42 of the animal training device above described with electric circuitry for the converter is mounted in the forward portion of the forward outer housing section 66 and is held firmly by a layer of epoxy 73. In this form, however, the pair of electrodes 65 and 64 are affixed to and project out from the end of the housing 42 as distinguished from the sides in the earlier form. A lead line 74 connects from electrode 65 to the forward outer housing section via 72. A rear end wall 75 of a non-conductive material supports a contact 76 for the dry cell batteries designated 11c and 11d.

The rear outer housing section 68 has a male joint portion 77 comprised of a tube 78 of reduced diameter with a beveled edge 79 and a groove 81 inset from the end and beveled edge at the end adapted for insertion into a female socket in a handle described hereinafter. Moreover, the rear outer housing section 68 carries a transverse disc 82 with a pin-like contact 69 on the inside as well as having an inner annular retaining flange 84.

Within the intermediate housing section 71 there is telescoped the inner housing section 86 containing dry cell batteries 11c and 11d and having an external flange 87 at the rear end that is rearward of flange 84 so as to be held against pulling out of the rear outer housing section 66 by butting against the internal flange 84. The inner housing has an end cap 88 with an aperture and a bias spring 89 between the rear battery 11d and the end cap 88.

As best seen in FIG. 11, the forward outer housing section 66 has an inside projection 91 which inserts into a slot 92 in the intermediate housing section 71 and opens into the forward end thereof. This slot 92 extends rearwardly and turns back in an end portion 92a that retains the intermediate housing section 71 inside the forward outer housing section.

In assembling the housing assembly the intermediate housing section 71 is inserted into the forward outer housing section 66 and the projection 91 is positioned in slot 92 and moved to the rear position, the forward outer housing section twisted and the projection 91 then is urged by spring 89 into the slot portion 92a. Upon the pressing of the electrodes 64 and 65 against an object, the forward outer housing section 66 and intermediate housing section 71, which are electrically connected by a forced fit relationship, are moved relative to the rear outer housing section 68 causing contact 69 to engage the anode of the rear battery 11d whereby to complete the circuit, and upon removal of the pressure the forward outer housing section 66 and intermediate housing section 71 move forwardly from the rear housing section 68 and the circuit is broken by the action of the bias spring 67.

Since the cattle prod device of FIGS. 8–11 is usually used on cattle, it may be convenient for extra reach to attach the device into a handle 95 illustrated in more detail in FIGS. 12–14. To this end the handle 95 has a hollow tubular portion with a grip 96 at one end and open at the other end that is sized so that the male portion 77 of the cattle prod device 60 will insert therinto. As best seen in FIG. 13, the female part of the socket is inset from its open end and includes an annular tapered female socket portion 97 affixed to the inside of the tube with an inner tubular section adapted to receive the male end portion in a force-fitted joint. The female socket portion 97 has a slot 98 along each side to allow for flexibility of the opposed finger portions.

For yet a greater reach to apply the electrodes to a steer, cow or the like over a greater distance, there is shown in FIGS. 15–17 an extensible handle assembly 101 which is comprised of a front tubular section 102 having an open front end with an internal female socket into which the cattle prod device 60 is inserted and held in the female socket inset in from the open end as with the previous rigid handle 95, an intermediate tubular section 103, and a tubular handle section 104 with a grip 105.

As best seen in FIGS. 16 and 17, a locking cam 106 is mounted on the rear end of front tubular section 102 and is telescoped within section 103 and a locking cam 107 is mounted on the rear end of tubular section 103 and telescoped within section 104. The front tubular section 102 then is telescopically received in the intermediate tubular section 103 and in turn the intermediate tubular section 103 is telescopically received in the handle section 104. The rear ends of the front tubular section with its locking cam 106 and the intermediate tubular section with its locking cam 107 allows the telescoping sections to be locked together against relative longitudinal movement for a given position for the locking cam.

Referring now to locking cam 107, this is shown as comprised of a hub 111 of a diameter that will slide inside section 104 having a center CL1, an offset or eccentric shaft on a center CL 2 and an end hub on center CL1. As the hub 111 is rotated about its axis CL1 the offset shaft 112 moves the outer hub 111 to a frictional engagement with the inside of the wall of the tubular handle section 104 and the sections 103 and 104 are held against relative longitudinal movement. When rotated further there is a position wherein the tubular intermediate section 103 slides freely relative to the outer handle section 104. The operation of locking cam 106 in relation to tubular sections 102 and 103 is the same.

By way of illustration only and not by way of limitation, there are listed below components that have been found suitable for use in the illustrated devices:

| Component | Value | Type and Model No. |
| --- | --- | --- |
| 11a, 11b | 1.25 volt, each | Nickel Cadmium, Eveready V20 |
| 28 | Small Signal RF | A5T3821 Texas Instruments |
| 29 | Small Signal RF | HEPF1035 Motorola |
| 35 | Medium Power | 2N3904 |
| 36 | Medium Power | 2N3904 |
| D1 to D11, inclusive | 2.5 amp 1.KV | R170 International Rectifier |
| 31 | 2.5mH | 70F253A1 J. W. Miller |
| 15 | 1:100 | |
| C6 | 300pf | Ceramic disc |
| C5, C15 | 250pf | Ceramic disc |
| C4, C14 | 200pf | Ceramic disc |
| C3, C13 | 150pf | Ceramic disc |
| C2, C12 | 100pf | Ceramic disc |
| C1, C11 | 50pf | Ceramic disc |
| 40 | 2-70pf | |
| 11c, 11d | 1.5 volt each | AA cells |
| 12 | 250KHz | |

The approximate size of the housing 42 for the animal training device is:
Width; 13/16 inch
Height; 9/16 inch
Length; 2¼ inch The approximate voltage gain for network 16 for the circuit with the above listed values is about 14.7; the approximate voltage output of the animal training device is about 660 v. DC; the approximate output of the cattle prod device is about 1450 v. DC.

Although the present invention has been described with a certain degree of particularity, it is understood that the present disclosure has been made by way of example and that changes in details of structure may be made without departing from the spirit thereof.

What is claimed is:

1. A DC voltage step-up converter for a voltage utilization device and the like comprising:
   oscillator means including an inductor for converting the DC voltage of a battery to an oscillating voltage that goes positive and then negative in each cycle in relation to a zero reference;
   transformer means coupled to said oscillator means by an impedance interface means coupled to said inductor providing a high impedance in parallel with said inductor that drives said transformer means for increasing said oscillating voltage to a higher oscillating voltage; and
   a capacitor charging voltage step-up means coupled to said transformer means having an input terminal and an output terminal, said network means converting said higher oscillating voltage applied to said input terminal to an increased substantially DC voltage at said output terminal.

2. A DC voltage step-up converter as set forth in claim 1 wherein said oscillator means includes a pair of series connected field effect transistors which in turn are connected in series with said inductor to form an electric oscillator.

3. A DC voltage step-up converter as set forth in claim 2 wherein there is an N channel junction field effect transistor and a P channel junction field effect transistor, the N channel junction field effect transistor has a JFET gate connected to said inductor to be biased by said inductor voltage, and said P channel junction field effect transistor has a JFET gate biased by the voltage of a DC battery.

4. A DC voltage step-up converter as set forth in claim 1 wherein said transformer means includes an electromagnetic transformer with a core and a primary winding and a secondary winding on said core.

5. A DC voltage step-up converter as set forth in claim 4 wherein said inpedance interface means is coupled between said oscillator means and the primary winding of said transformer.

6. A DC voltage step-up converter as set forth in claim 5 wherein said impedance interface includes a two-stage transistor network connected in a Darlington configuration receiving voltage from said inductor and said battery and providing a high impedance in parallel with said inductor to interface between said inductor and the primary winding of said transformer.

7. A DC voltage step-up converter as set forth in claim 1 wherein said capacitor charging voltage step-up means is a network inclusive of a series of successively charging capacitors, each of said capacitors being progressively smaller, between an input terminal and an output terminal whereby as a result of the difference in charging time the net effect is a charge on each of said capacitors that is cumulative between said input terminal and said output terminal.

8. A DC voltage step-up converter as set forth in claim 7 wherein said capacitor charging voltage step-up network includes:

a first charging capacitor coupled between the input terminal and ground;

a plurality of successive charging capacitors connected in a series circuit between said input terminal and said output terminal, the capacitance value of each successive charging capacitor being less proceeding from the input terminal to the output terminal, said plurality of successive charging capacitors being coupled to said first charging capacitor thereby placing said first charging capacitor and said series circuit in series with one another between the output terminal and ground, the capacitance value of said first charging capacitor being greater than the closest capacitor in said series circuit; and rectifier means operatively associated with said first capacitor and said plurality of successive charging capacitors to rectify the higher oscillating voltage whereby, as a result of the difference in charging times of the first and plurality of successive charging capacitors, the net effect is a charge on said capacitors that is cumulative between the input terminal and output terminal and substantially greater in amplitude than the amplitude of said higher oscillating voltage.

9. A DC voltage step-converter as set forth in claim 8 wherein said rectifier means includes a first diode in series with said first charging capacitor between the output of said secondary winding and ground.

10. A DC voltage step-up converter as set forth in claim 9 wherein said rectifier means includes a pair of diodes connected in series with one another and connected across one of each of said network of series of successively charging capacitors, said first diode and said pairs of diodes being in series with one another between the output of said secondary winding and said output terminal.

11. A DC voltage step-up converter as set forth in claim 10 including a neutralizing and charging capacitor connected across the first and next adjacent of said diodes and one neutralizing and charging capacitor connected across each succeeding pair of diodes toward said output terminal, each neutralizing and charging capacitor having the same capacitance as a charging capacitor in said network of series of successively charging capacitors.

12. A DC voltage step-up converter for a voltage utilization device and the like comprising:

a DC battery;

an electric oscillator coupled to said DC battery including an inductor for converting the DC voltage of said battery to an oscillating voltage that goes positive and negative in each cycle in relation to a zero reference;

a low voltage transformer coupled to said electric oscillator having a core, a primary winding on the core for increasing said oscillating voltage to a higher oscillating voltage;

an impedance interface coupled to said inductor providing a high impedance in parallel with said inductor and coupled between said inductor and said primary winding for isolating said inductor from said primary winding and driving said primary winding;

a capacitor charging voltage step-up network having an input terminal coupled to the output of said secondary winding and having an output terminal for increasing the voltage induced in said secondary winding; and an electric switch portion adapted for selective actuation by the user for activating said electric oscillator whereby a substantially DC voltage is produced at said output terminal.

13. In a voltage utilization device, the combination comprising:

a housing;

a pair of voltage-applying electrodes on said housing, one of said electrodes being connected to ground;

a DC battery in said housing providing a DC voltage;

an electric oscillator coupled to said DC battery including an inductor for converting the DC voltage to an oscillating voltage that goes positive and negative in each cycle in relation to a zero reference;

a transformer coupled to said electric oscillator by an impedance interface means coupled to said inductor providing a high impedance in parallel with each inductor that drives said transformer means for increasing the oscillating voltage to a higher oscillating voltage; and a static voltage step-up network coupled to the output of said transformer for increasing the voltage output of the transformer, said increased voltage being selectively applied to the other of said pair of electrodes.

* * * * *